United States Patent
Batlogg et al.

(10) Patent No.: US 6,630,425 B1
(45) Date of Patent: *Oct. 7, 2003

(54) DEVICES AND SYSTEMS BASED ON NOVEL SUPERCONDUCTING MATERIAL

(75) Inventors: Bertram Josef Batlogg, New Providence, NJ (US); Robert Joseph Cava, Basking Ridge, NJ (US); Robert Bruce van Dover, Berkeley Heights, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 07/027,371

(22) Filed: Mar. 18, 1987

Related U.S. Application Data

(63) Continuation-in-part of application No. 07/024,026, filed on Mar. 10, 1987, which is a continuation-in-part of application No. 07/021,229, filed on Mar. 3, 1987, which is a continuation-in-part of application No. 07/001,682, filed on Jan. 9, 1987, now abandoned.

(51) Int. Cl.$^7$ ..................... H01B 12/00; C04B 101/00
(52) U.S. Cl. ..................... 505/126; 505/230; 505/879; 505/884
(58) Field of Search ................... 252/518, 521; 29/599; 420/901; 423/263, 593; 428/930; 501/123, 152; 505/125, 126, 879, 884, 230

(56) References Cited

PUBLICATIONS

M.K. Wu et al., "Superconductivity at 93K in a New Mixed–phase Y–Ba–Cu–O Compound System at Ambient Pressure", *Phys. Rev. Lett.*, vol. 58, No. 9, pp 908–910, 1987. [Referred to in motions in Interference 101,981 as Chu Reference No. 1.].

P.H. Hor et al., "High–Pressure Study of the New Y–Ba–Cu–O Superconducting Compound System", received by *Phys. Rev. Lett.*, Feb. 6, 1987, revised manuscript received by Phys. Rev. Letters Feb. 18, 1987, Published *Phys. Rev. Lett.*, vol. 58, No. 9, pp. 911–912, 1987. [ferred to in motions in Interference 101,981 as Chu Reference No. 2.].

C. W. Chu et al., "Superconductivity at 98K In The Y–Ba–Cu–O Compound System at Ambient Pressure", submitted to *Phys. Rev. Lett.* in Feb. 1987. [Referred to in motions in Interference 101,981 as Chu Reference No. 3.].

C. Michel et al., "Oxygen Intercalation In Mixed Valence Copper Oxides Related To The Preovskites", Rev. Chim. Miner., 21, No. 4, pp. 407–425, 1984.

J.J Rhyne, et al., "Phonon Density of Superconducting Y $Ba_2Cu_3O_7$ and the Nonsuperconducting Analog $YBa_2Cu_3O_6$" Physical Review B., 36(4), pp. 2294–2297, 1987.

T. S. Shaplygin, et al., "Preparation and Properties of The Compounds $Ln_2CuO_4$ (Ln = La,Pr,Nd,Sm,Eu,Gd) and Some of Their Solid Solutions", Russian Journal of Inorganic Chem., 24, (6), pp 820–824, 1979.

Orlando McNiff Foner & Beasley, Physical Review, B19, pp. 4545–4561, 1979.

R. J. Cava et al., Phys. Rev. Lett., vol. 58, No. 16, pp. 1676–1679, 1987.

D.W. Murphy et al., Phys. Rev. Lett., vol. 58, pp. 1888–1890, 1987.

*Primary Examiner*—Mark Kopec
(74) *Attorney, Agent, or Firm*—G. S. Indig; E. E. Pacher; M. I. Finston

(57) ABSTRACT

Superconducting copper oxides of the perovskite structure are modified to have mixed occupancy of a cation site, thereby resulting in increased limits in critical field and/or critical current. Mixed occupancy may be observed in terms of increased resistivity as the superconducting material reverts to a nonsuperconducting state. A significant advantage, at least for preferred compositions, derives from the fact that critical temperature is unaffected relative to the prototypical material.

4 Claims, 5 Drawing Sheets

DEVICES AND SYSTEMS BASED ON NOVEL SUPERCONDUCTING MATERIAL

CROSS-REFERENCE TO RELATED APPLICATION

This is a continuation-in-part of application Ser. No. 07/024,026 filed by B. J. Batlogg, R. J. Cava and R. B. van Dover filed on Mar. 10, 1987, which in turn is a continuation-in-part of application Ser. No. 07/021,229, filed by the same applicants on Mar. 3, 1987, which in turn is a continuation-in-part of application Ser. No. 07/001,682 now abandoned, filed by the same applicants on Jan. 9, 1987.

BACKGROUND OF THE INVENTION

The interplay between various properties of materials in their non-superconducting state, such as $\rho$, the resistivity, and $\gamma$, and their superconducting properties such as $H_{c2}$, the upper critical field, has been examined intensively since 1959, beginning with the work of Gorkov, who first related the microscopic theory of Bardeen-Cooper-Schrieffer (BCS) to the phenomenological theory of Ginzburg-Landau (G-L), and extended significantly by Abrikosov to explain the properties of technologically important materials. This accumulation of knowledge is referred to as Ginzburg-Landau-Abrikosov-Gorkov (GLAG) theory and has been refined and extended by many investigators. The relationship between some important superconducting properties and normal state parameters was recently summarized by Orlando McNiff Foner & Beasley, (Physical Review, B19, p. 4545, 1979). Here it is shown that in $Nb_3Sn$, a superconducting material which has been employed in the highest-field magnets currently in operation, the upper-critical field at, e.g., 4.2 K, can be significantly improved by increasing the resistivity of the material, albeit at the expense of a reduction in $T_c$. This reduction in $T_c$ is likely responsible for the fact that the described increase in upper initial magnetic critical field has not received more serious attention. As far as can be determined, superconducting devices based on the A-15 compounds have not taken advantage of increased field values due to mixed cation occupancy.

A resurgence in interest in superconductivity worldwide is ascribable to the emergence of substituted copper oxide superconductors, the most significant of which show high critical temperatures—many in a range amenable to liquid nitrogen cooling. Exemplary materials of this "perovskite" class are completely superconducting at temperatures in the range of 90–100 K (temperatures sufficiently removed from liquid nitrogen temperature to permit attainment of significant superconducting properties (Phys. Rev. Lett., Vol. 58, see, for instance, R. J. Cava et al, page 1676, and D. W. Murphy et al, ibid, page 1888).

SUMMARY OF THE INVENTION

This invention originated in the investigation of the properties of various examples of the phases described in a previous application. It was noticed that certain substitutions in the quaternary perovskite phases led to greatly enhanced high-field properties which are correlated to the increase in resistivity. While the GLAG formulation of the microscopic theory may not be obeyed in detail in these materials (e.g., if the superconductivity is not due to the usual electron-phonon interaction), the interplay between $\rho$ and $H_{c2}$ may nevertheless be qualitatively similar.

In contrast to work described in the "Background", it has been found that chemical substitutions made in perovskite copper oxide-based superconductors may give rise to increased values of the critical magnetic field for given current density or, conversely, increased current density for given values of magnetic field or combination of increased values of both. Unlike prior work reported under "Background of the Invention", substitutions in accordance with the invention have no significant effect on the temperature of the onset of superconductivity (i.e., the value of $T_c$ is not significantly changed).

The category of materials to which the invention applies is that of parent application, Ser. No. 07/024,026, (filed Mar. 10, 1987). The category of materials so encompassed and as described in the parent application is set forth under the Detailed Description herein.

The invention depends upon the finding that mixed occupancy, by M or M' elements within the general formulation $M_{3-m}M'_mCu_3O_x$ under the constraints set forth gives rise to an increase in critical magnetic field and/or current density under any given set of real operating conditions.

Simply stated, the inventive finding is to the effect that mixed occupancy in the "A" site, as described, gives rise to a critical field value increase for any given temperature. (The "A" site is occupied by the M and M' elements and refers to the conventional "$ABO_3$" designation for the primitive cell in the perovskite structure.) In terms of utilization this may take a variety of significant forms including:

1) Magnet structures capable of producing increased field,
2) Magnet structures of reduced size for a given required field,
3) Any other use in which superconducting properties are limited by magnetic field (circuitry might be subjected to a significant field due to proximity to a high field magnet or for whatever other reason. Stated differently, the inventive advance may be expressed in terms of higher permitted current density for any given magnetic environment.

For descriptive purposes, compositions of the invention are described in terms of prototypical compositions in which the A site in the "pure" compound consists of but a single divalent ion species, e.g., Ba, and but a single trivalent ion species, e.g., Y or Eu. Improvement in critical magnetic field of at least about,5% under given operating conditions corresponds with introduction of additional ions into the A site (into the M and/or M' location) by an amount of at least about 1 at. % based on the total number of atoms in the A site. More preferred limitations correspond with critical field improvements of at least 10% corresponding with inclusion of about 2 at. % of third A site ions. Realization of critical field improvement at given operating conditions of 100% or more corresponds with mixed A site occupancy in which a third ion is included in amount of at least 10 at. percent based on the total number of (M and M') ions in the A site.

The invention consists of the optimization of the properties of quaternary cuprate superconductors by partial substitution. Nominal compositions may be represented by the nominal formula $M_{2-y}M'_{1-z}X_{y+z}Cu_3O_x$ where M=Ba, M' is one of Y, Eu, or La, and X is at least one element different from M or M', and is one of elements 57–71 or Y, Sc, Ca or Sr. In general, significant increase in $H_{c2}$ corresponds with z+y values of from 0.3 to 1.0 with the provision that both M and M' be at least 50 at. % unsubstituted. The choice of substitution element X and amount z+y is dictated by the increase in resistivity which is sought. An important aspect of this invention is that, for many of the substitutions, the increase in resistivity does not come at the expense of a significant decrease in $T_c$ as viewed in terms of a reference compound of unsubstituted M/M' composition in terms of majority M/M' atoms. Other variations in the unsubstituted compounds—particularly variations from the nominal formula—are set forth in the most recent parent application.

Definitions

While the terminology used in the description is well known to the artisan, it is convenient to set it forth:

$H_{c1}$—Critical field value at which the Meisner effect is complete (magnetic flux is totally excluded).

$H_{c2}$—Critical field value above which all evidence of superconductivity is absent. (This term is meaningful in Type II superconductivity to which the invention is restricted in which real operation at values intermediate $H_{c1}$ and $H_{c2}$ correspond with superconducting conditions under which supercurrents are actually carried, even though the entire cross-section of the material may include local regions which are non-superconducting).

$T_c^{onset}$—This is the temperature at which there is initial evidence of superconductivity, e.g., in terms of a significant change in slope of resistivity as a function of temperature.

$T_c^{R=0}$—The value of temperature at which there is a continuous path between applied electrodes such that the measured resistance between electrodes is zero.

$T_c^{midpoint}$—The value of temperature which is equidistant between $T_c^{onset}$ and $T_c^{R=0}$ in terms of resistance expressed.

$J_c$—critical current which, as in usual terms, defines the maximum current at which the sample is superconducting under given conditions (temperature and field).

Figure 1:
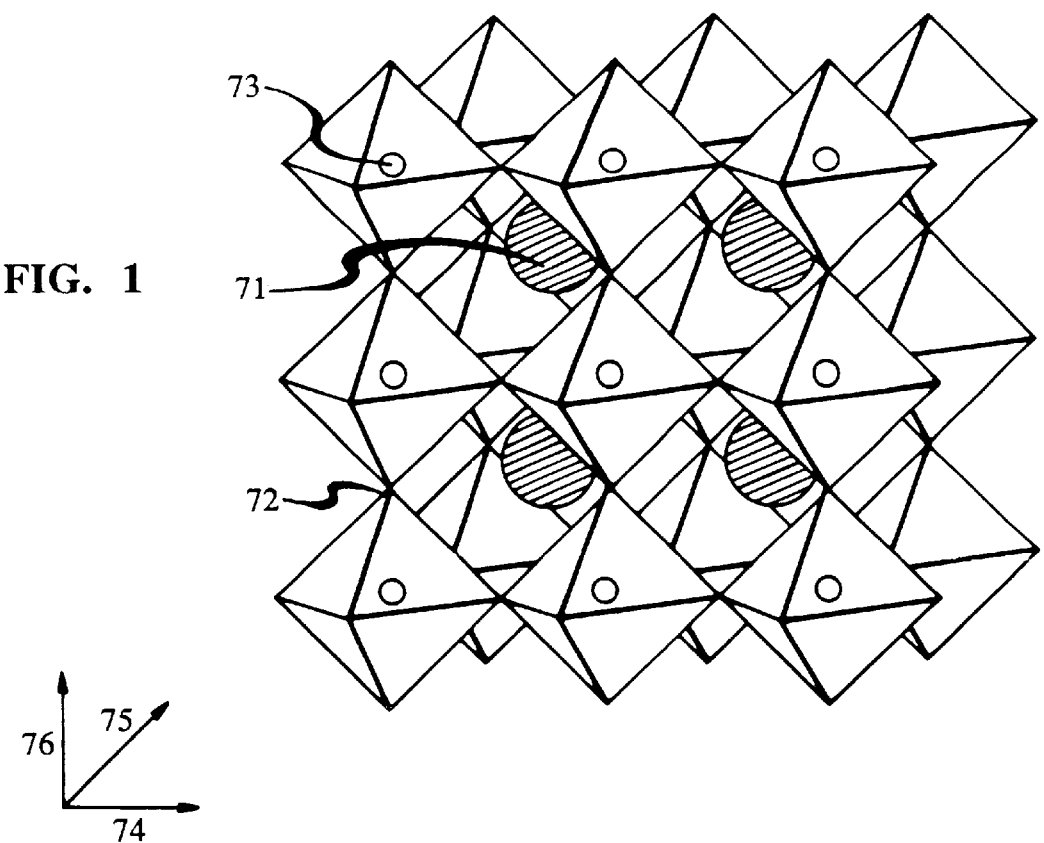
FIG. 1 is a diagrammatic representation of the ideal cubic perovskite structure. As described further on, it serves as a basis for structures in this invention which may entail distortions to lower symmetry and/or deviations from nominal stoichiometry.
Figure 8:
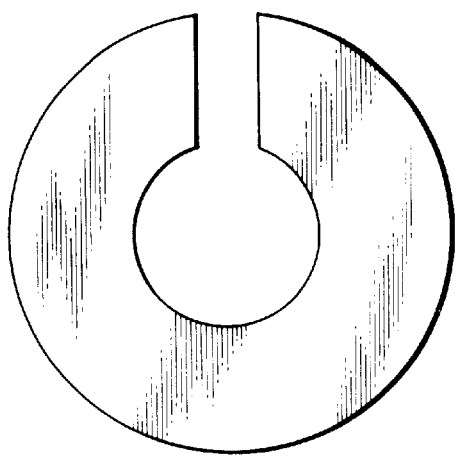
Figure 2:
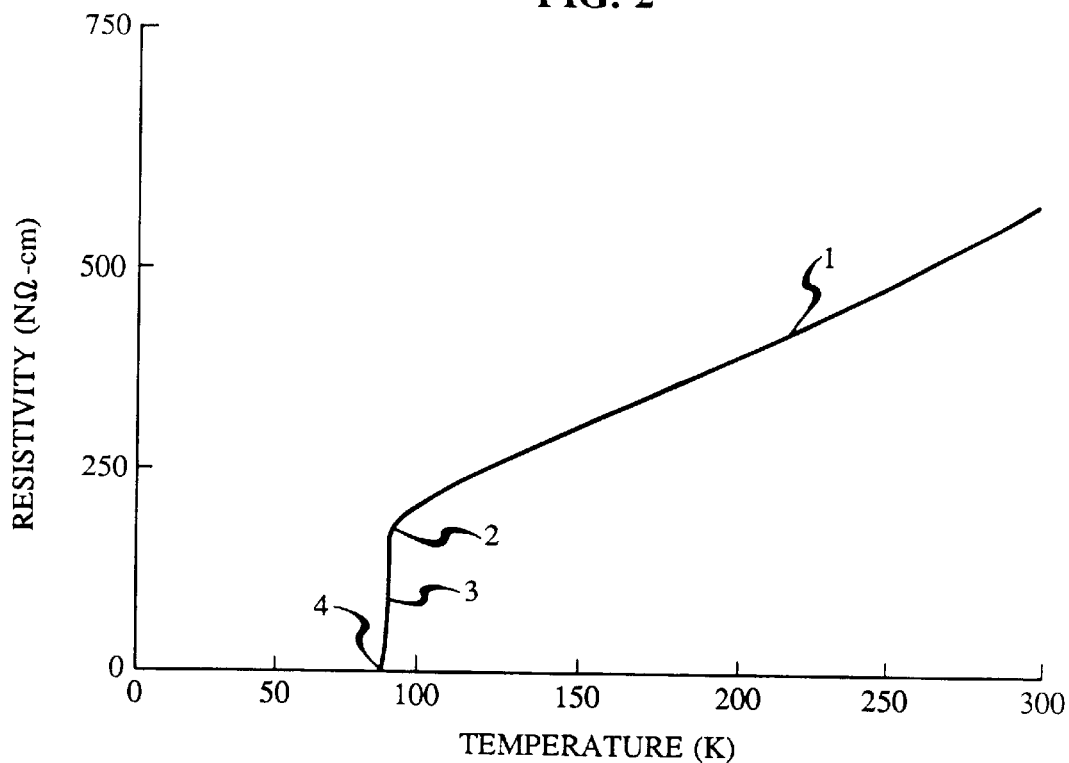
FIGS. 2 and 3, on coordinates of resistivity and temperature, plot characteristics of materials made in accordance with the Examples on different coordinate scales. The curve form is useful in identification of the various values of $T_c$ as the term is used in the art.
Figure 3:
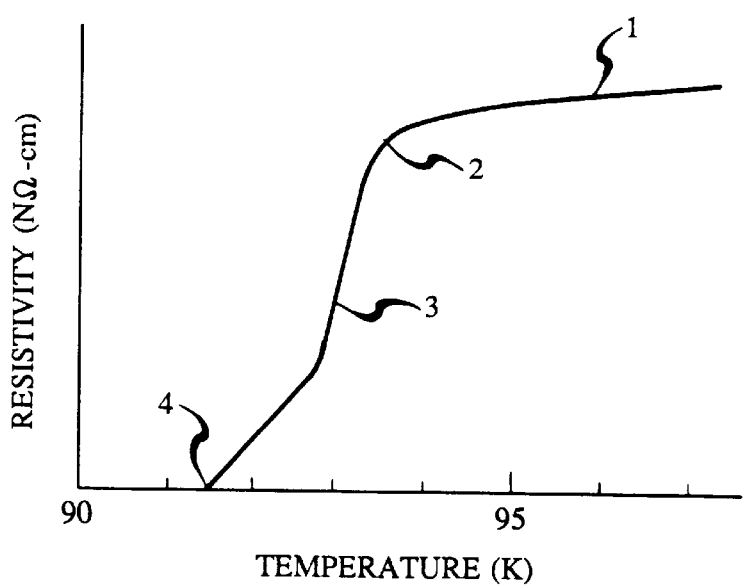

The element of FIG. 8 is representative of structures which advantageously make use of thin sheet material. The particular structure represented is a "Bitter" type magnet which is quite familiar to workers in the art. A recently filed U.S. patent, Gyorgy-Johnson 26–18, filed Mar. 16, 1987, depends upon structures which include perovskite compositions produced, e.g., as tape, extruded rod, silk-screened patterns, etc. in which initial material is formed with the assistance of binder, subsequently removed to leave the fired superconducting material. Such structures as so prepared are exemplary of forms suitably incorporating compositions of the invitation.

DETAILED DESCRIPTION

The initial portion of this section reiterates fundamental material consideration as set forth in the parent application, Ser. No. 07/024,026, filed Mar. 10, 1987.

Most significantly, the origin of the invention is in terms of superconducting copper oxide compounds, basically of the perovskite structure, with mised cation "A" site occupancy, as described in the "Summary". As in the parent case filed Mar. 10, 1987, the responsible single phase material, here identified as "perovskite", naturally lead to total as well as partial substitutions; to establishment of criteria determinative of parameters such as cation concentrations, permitted oxygen content (always deficient in terms of the prototypical composition) as well as average valence state of the copper ion (crucial in terms of the mechanism which may be regarded as responsible for supplying conduction electrons). As in the noted parent application, the role of the perovskite is crucial so long as the superconducting element is not a single crystal (e.g., in the ceramic form of many of the reported experiments herein). An important attribute has to do with facilitation of larger crystallites and as possibly aided by improved intergrain contact with resulting enhanced current-carrying capability.

Structure

Materials of the invention are preferably single phase. By this it is meant that the materials herein are single phase preferably to at least 95 mole percent as determined by powder x-ray diffraction. The particular value, 95 percent, is chosen as corresponding with the expected measurement precision of ordinary apparatus—procedures. While such "truly" single phase material is to be preferred and will doubtless be the ambition for practical usage, compositional as well as preparatory considerations (e.g., film formation) leads to the more general requirement that materials be single phase to 75 mole percent. Even somewhat larger amounts of second phase material are permissible for uses in which maximum current density is not required.

It is most significant that the single phase so identified is "perovskite". The quoted term as used herein is meant to include not only the prototype, truly cubic material, but very significantly distortions therefrom. As indicated, other variation from the nominal perovskite is in terms of stoichiometry. Analyzed materials of the invention show oxygen occupancy of 6.5–7.1, significantly below the nominal composition of 9 for a non-deficient perovskite. This translates into δ values of 1.9 to 2.5 in terms of the formula containing $O_{9-\delta}$. A somewhat wider range is still expected to superconduct.

As with pre-invention perovskite copper oxide superconductors, there are two significant compositional contributions to the structure. These are discussed in more detail in a following section relating (a) to observed oxygen deficiencies which reduces the coordination number of a portion of the copper from six to five or possibly four, and (b) mixed occupancy of the "A site" (in the prototypical representation $ABO_3$), i.e., occupancy by ions represented as M and M' in the general formula above—gives rise to a further variation. X-ray diffraction studies, indicating single phase material, translate into substantial ordering of M and M' ions in selected compositions which, in turn, gives rise to a unit cell size larger than that of the primitive cell corresponding with the single formula unit $ABO_3$. This is true for many compositions or modified in accordance with the invention. X-ray diffraction measurements of a preferred composition before modification—nominally $Ba_2YCu_3O_{6.9}$ indicate a crystallographic unit cell orthorhombic symmetry, of size a=3.87, b=3.86, c=11.67 Angstroms. This crystallographic cell is a "supercell" of the cubic $ABO_3$ and is of three times the volume due to subtle ordering effects. Other compositions may show different "supercells" or exhibit "supercells" whose diffraction signatures are too weak to be observed by conventional x-ray powder diffraction techniques. Such supercells are well known in perovskite structure type materials. Isolation of single crystalline material has permitted verification of the above. In compositions herein in which M and M' ions differ in size sufficiently (e.g., in terms of an ionic radius ratio of at least 1.2), these materials are truly ordered for compositions in which inclusion of M/M' ions nominally follows the ratio 2/1, the repeating unit includes three primitive cells. While preferred compositions generally meet the ion size requirements for ordering, other superconducting compositions of the invention do not. So, for example, compositions which are predominantly M=Ba, M'=La, are based on M/M' radii which do not inherently result in ordering. Considerations such as material cost and ease of processing may lead to selection of such compositions which, in these terms, may be "disordered"—this is not altered by the inventive teaching.

Composition

The prototypical composition has been described in terms of $M_{3-m}M'Cu_3O_{9-\delta}$. Oxygen content is critical and is set forth at the nominal value of 7 ($9-\delta=7$). Permitted variations in measured compounds give rise to a suggested range of oxygen content in this formula of $7.9<\delta<2.5$. It is conventional to express the same formula in terms of inclusion of $O_x$. In these terms, the corresponding x range is from 6.5 to 7.1 As described in some detail in the parent application, compositions are generally such as to correspond with an average copper valence state of from 2.0 to 2.4 ($2.0<n<2.4$ for $Cu^{n+}$).

Prototypical compositions (compositions not yet substituted in accordance with the present requirements) are discussed in terms of permitted occupancies:

M=Barium (Ba)

M'=Yttrium (Y), Europium (Eu), Lanthanum (La),

Cu-Materials of the invention are all nominally copper oxides.

For these purposes, materials treated herein owe their superconducting properties to that fraction of the material which contains Cu in this site.

Compositions listed above are in no sense limiting. The inventive teaching, while certainly dependent upon superconducting copper oxide materials, as generally described, all of the "perovskite" structure, as also described, derives primarily from mixed A site occupancy, as described, and is intended to include all superconducting compositions meeting these general requirements, whether or not containing the specific A site ions set forth.

As discussed, the invention depends upon mixed occupancy of A site ions—depends upon inclusion of at least one additional ion. Stated differently, the inventive concept depends upon inclusion of at least three chemically distinct atoms in the A site (M+M' occupancy$\geq$3 chemically different ions). The inventive result, whether expressed in terms of increased field, increased current, or a combination of the two, is dependent upon introduction of at least a third ion into the A site. Experimental evidence, as seen from the example table, is consistent with the inventive requirement in terms of substituent ions which do not destroy the relevant superconducting perovskite structure. It is seen that partial substitution for M and/or M' ions results in the inventive advance. Permitted partial substitutions for M' include many atoms which cannot serve as total M'/M substituents. (The required superconducting perovskite structure, as defined, is retained for partial substitutions of any of the lanthanide rare earths elements Nos. 57–71, as well as Sc and Y).

In common with understanding of more conventional superconductors, enhanced superconducting properties of the nature of those with which the invention is concerned may be described in terms of the resistivity of the composition at the point at which the material becomes non-superconducting. A particular composition (example 2) manifests a linear relationship between improvement (in terms of $H_{c2}$) and resistivity. This comparison is made on the basis of materials which were prepared in identical fashion but for the partial substitution required by the invention. While no requirement, observations to date based largely on observed increase in $H_{c2}$, suggest that the resistivity values alluded to scale with bulk resistivity values.

As set forth under the "Summary", an inventive requirement from the compositional standpoint is mixed occupancy in the A site (for either or both of the M and M' ions) in terms of inclusion of at least 1 at. % of a third A site ion (a third cation other than copper in the overall composition). Preferred compositions include at least 5 at. % in the same terms. Based on the fact that 25 at. % substitution yielded three-fold improvement in $H_{c2}$, a still more preferred compositional class is expressed in terms of at least 10 at. % (yielding~100% improvement in $H_{c2}$.

EXAMPLES

Figure 4:
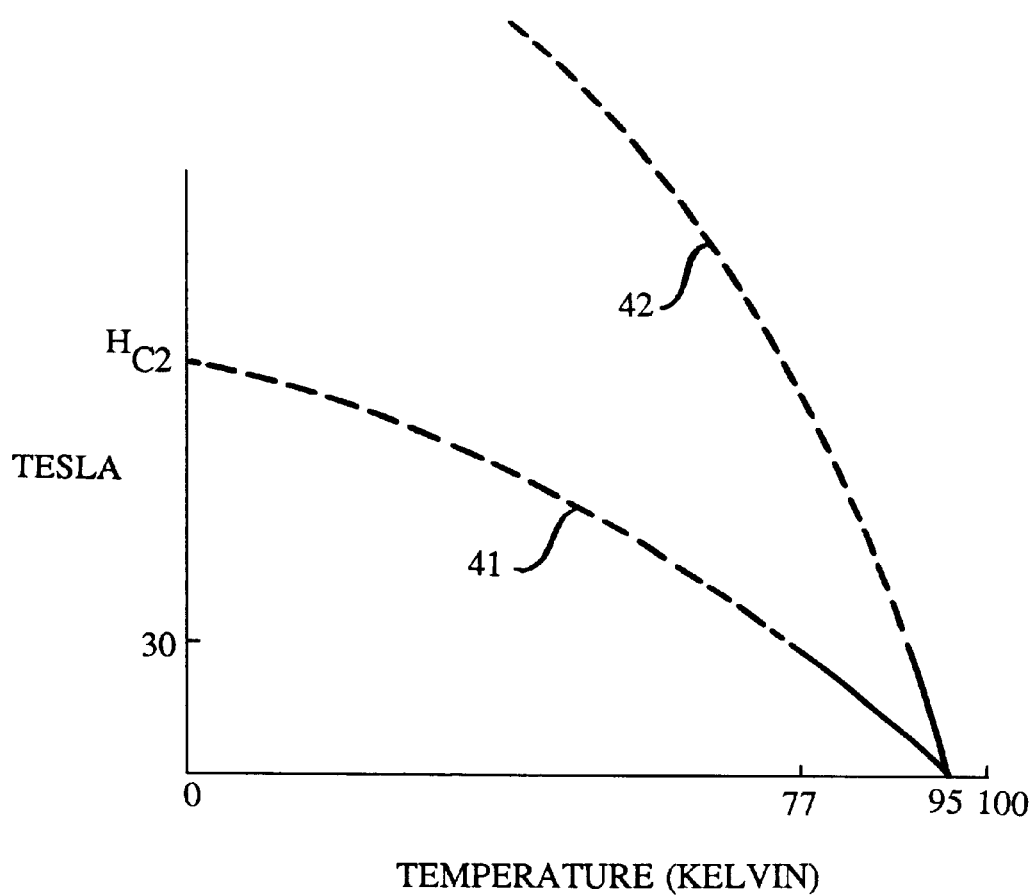
FIG. 4, on coordinates of magnetic field and temperature, plots the superconducting phase boundary for unsubstituted and an exemplary substituted material in accordance with the invention. The dashed lines represent rough extrapolations of the data.
Figure 5:
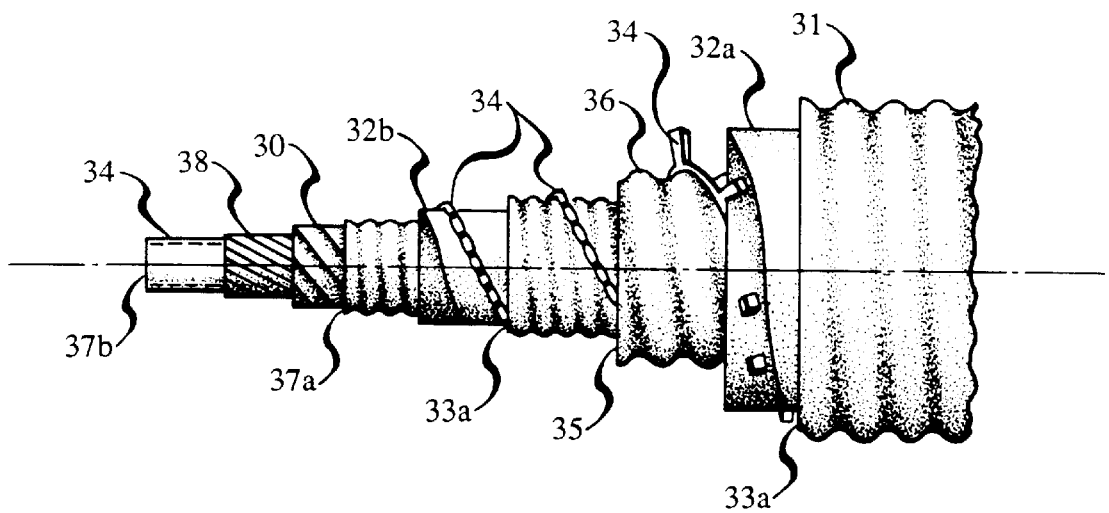
FIG. 5 depicts a cable design incorporating a superconducting element of an inventive composition.
Figure 6:
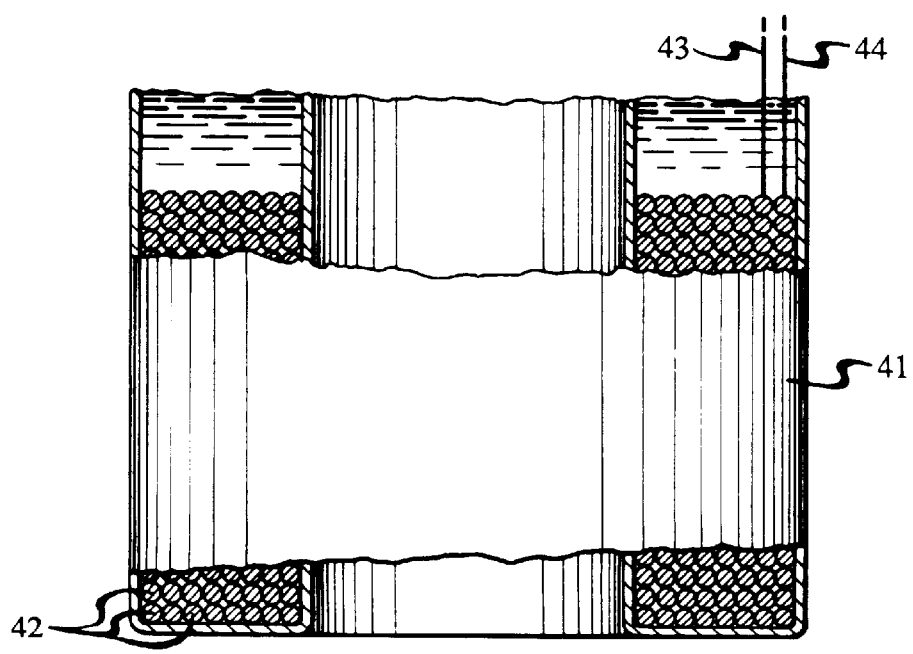
FIG. 6 depicts a superconducting solenoid.
Figure 7:
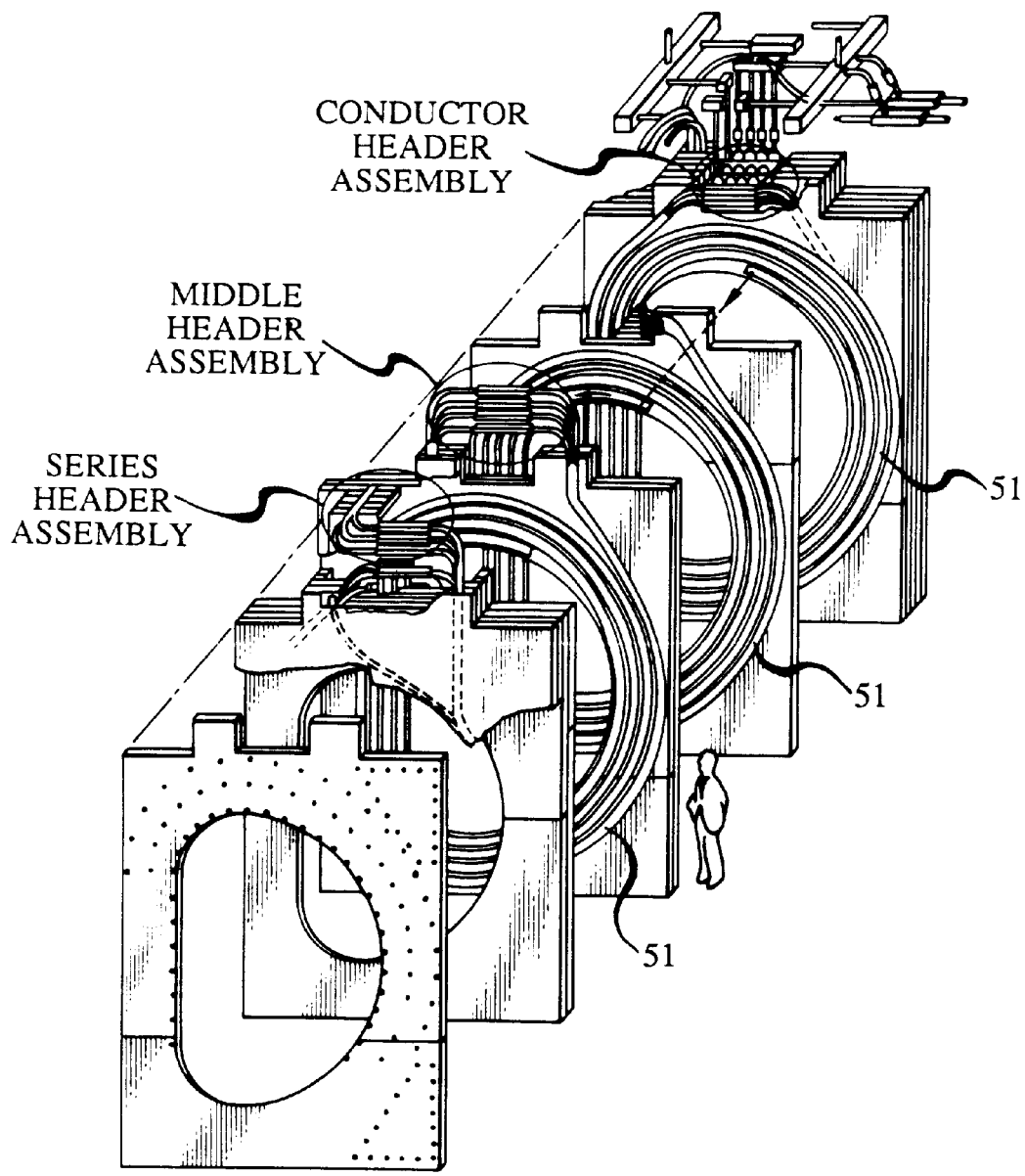
FIG. 7 represents a superconducting torus suitable for use for fusion reaction confinement.

Examples 2, 3, 5, 6, 7, 8, 9, 10, set forth in tabular form, show mixed A site occupancy as required by the invention. Examples 1 and 4 are included as reference (unmixed) compounds. For convenience, compositions set forth are in terms of resistivity as measured with the material having initially reverted to its non-superconducting state. It is well established that this is a sufficient criterion for improvement in superconducting properties. The first two entries, for example, correspond respectively to the prototypical unsubstituted BaY compound, and such a compound in which Y is replaced by 75 at. % Eu resulted in three-fold improvement in $H_{c2}$. This is indicated by the measured slope increase in $(dH_{c2}/dT)T_c$. This increase is shown on FIG. 4. Curve 42 representing substituted material of the composition of example 2 has an increased slope compared with that of curve 41 representing unsubstituted material of the composition of example 1. This corresponds with an increase from 12 Tesla/Kelvin below $T_c$ (95 K) to 30 Tesla/Kelvin.

COMPOSITIONS AND SUPERCONDUCTING TRANSITION TEMPERATURES FOR EXAMPLE MATERIALS

| Example | Composition | $T_c^{onset}$ [Kelvin] | $T_c^{midpoint}$ [Kelvin] | $T_c^{R=0}$ [Kelvin] | $\rho(T \geq T_c^{onset})$ [$\mu\Omega$ cm] |
|---|---|---|---|---|---|
| 1. | $Ba_2YCu_3O_{9-\delta}$ | 93.5 | 93.0 | 91.5 | 260 |
| 2. | $Ba_2Y_{0.25}Eu_{0.75}Cu_3O_{9-\delta}$ | 96 | 95 | 94 | 800 |
| 3. | $Ba_2Eu_{0.9}Y_{0.1}Cu_3O_{9-\delta}$ | 96 | 95 | 94 | 320 |
| 4. | $Ba_2EuCu_3O_{9-\delta}$ | 96 | 94.5 | 93.5 | 740 |
| 5. | $Ba_2Eu_{0.9}Pr_{0.1}Cu_3O_{9-\delta}$ | 85 | 82 | 80 | 1860 |
| 6. | $Ba_2Eu_{0.75}Sc_{0.25}Cu_3O_{9-\delta}$ | 95 | 92 | 90 | 3000 |
| 7. | $Ba_{1.5}Sr_{0.5}YCu_3O_{9-\delta}$ | 89 | 87 | 86 | 1260 |
| 8. | $Ba_2Y_{0.75}Sc_{0.25}Cu_3O_{9-\delta}$ | 93 | 92 | 87 | 1860 |
| 9. | $BaCaLaCu_3O_{9-\delta}$ | 82 | 81 | 80 | 2100 |
| 10. | $Ba_2Y_{0.75}La_{0.25}Cu_3O_{9-\delta}$ | 92 | 87 | 82 | 4200 |

What is claimed is:

1. A superconducting element comprising at least one composition which is at least one of the copper oxide compounds having the nominal formula $Ba_{2-y}M'_{1-z}X_{y+z}Cu_3O_x$, wherein: at least 95 mole percent of said copper oxide composition is of a singe phase nominally of the perovskite structure and exhibits superconductivity;

M' is an element selected from the group consisting of Y, Eu, and La,

X is at least one element selected firm the group consisting of the elements of atomic number 57–71, Y Sc, Ca, and Sr and differing from M';

$y<2$, $z<1$, $y+z>0.03$, and $6.5<x<7.1$;

to at least some extent, Ba, M', and X occupy a crystallographic site designated A;

the superconducting composition has an upper critical field;

there exists a prototypical Composition that differs from said superconducting composition only in that the A site of the prototypicpal composition is occupied only by Ba and one element of M' and X, the prototypical composition also having an upper critical field; and relative to the prototypical composition, the degree of substitution of one or more further M' and/or X elements in the A site of said superconducting composition is sufficient to raise the upper critical field by at least 5%.

2. Superconducting element of claim 1 in which $y+z>0.15$.

3. Superconducting element of claim 1 wherein the superconducting composition has a critical temperature $T_c$ that is substantially the same as the corresponding critical temperature of the prototypical composition.

4. Process of conducting an electrical current through the superconducting element of claim 1, wherein the superconducting element is at a temperature T less than or equal to a critical temperature $T_c$ (R=0) of the superconducting composition, and the superconductive element is subject to a magnetic field of strength sufficient to result in reversion of an analogous element of the prototypical composition to a non-superconducting state under the same operating conditions.

* * * * *